United States Patent [19]
Kubota et al.

[11] Patent Number: 5,607,541
[45] Date of Patent: Mar. 4, 1997

[54] ELECTROSTATIC CHUCK

[75] Inventors: Yoshihiro Kubota; Makoto Kawai, both of Gunma-ken, Japan

[73] Assignee: Shin-Etsu Chemical Co., Ltd., Tokyo, Japan

[21] Appl. No.: 857,848

[22] Filed: Mar. 26, 1992

[30]     Foreign Application Priority Data

Mar. 29, 1991  [JP]  Japan .................................. 3-091233

[51] Int. Cl.$^6$ ..................................................... B32B 18/00
[52] U.S. Cl. .......................... 156/538; 156/598; 361/230; 361/234
[58] Field of Search ................................ 156/89; 361/234, 361/230; 29/25.92; 461/234; 501/12

[56]                References Cited

U.S. PATENT DOCUMENTS

| | | | |
|---|---|---|---|
| 3,965,552 | 6/1976 | Rutt | 29/25.42 |
| 4,143,182 | 3/1979 | Henney et al. | 427/343 |
| 4,384,918 | 5/1983 | Abe | 156/643 |
| 4,480,284 | 10/1984 | Tojo et al. | 361/230 |
| 4,604,318 | 8/1986 | Prior et al. | 428/289 |
| 4,692,418 | 9/1987 | Boecker et al. | 501/90 |
| 4,726,413 | 2/1988 | Hellebrand | 164/98 |
| 4,818,734 | 4/1989 | Kanter et al. | 501/128 |
| 4,828,774 | 5/1989 | Anderson | 264/60 |
| 4,911,992 | 3/1990 | Haluska et al. | 427/376.2 |
| 4,913,932 | 4/1990 | Moser et al. | 427/123 |
| 4,916,113 | 4/1990 | Newkirk et al. | 501/89 |
| 4,962,441 | 10/1990 | Collins | 361/234 |
| 5,001,594 | 3/1991 | Bobbio | 361/234 |
| 5,021,369 | 6/1991 | Ackerman et al. | 501/12 |
| 5,047,174 | 9/1991 | Sherif | 501/12 |
| 5,091,348 | 2/1992 | Woodhead et al. | 501/12 |
| 5,103,367 | 4/1992 | Horwitz et al. | 361/234 |
| 5,120,580 | 6/1992 | Lesher et al. | 427/376.2 |
| 5,139,852 | 8/1992 | Baise et al. | 428/209 |
| 5,141,773 | 8/1992 | Gilbert et al. | 427/228 |
| 5,144,536 | 9/1992 | Tsukada et al. | 361/402 |
| 5,166,856 | 11/1992 | Liporace et al. | 361/233 |
| 5,238,711 | 8/1993 | Barron et al. | 427/228 |

FOREIGN PATENT DOCUMENTS

| | | |
|---|---|---|
| 0260150 | 3/1988 | European Pat. Off. . |
| 0339903 | 11/1989 | European Pat. Off. . |

*Primary Examiner*—Laura Edwards
*Attorney, Agent, or Firm*—McAulay Fisher Nissen Goldberg & Kiel, LLP

[57]                ABSTRACT

An improvement is proposed in an electrostatic chuck, which is used in holding and transporting, for example, a semiconductor silicon wafer under processing in the manufacture of electronic devices, having an internal electrode layer sandwiched between two dielectric layers of a ceramic material. The disadvantage caused by the inherent porosity of the ceramic material can be dissolved by the invention according to which the pores are filled with a thermally decomposable liquid compound of silicon, aluminum and the like and then the ceramic material is heated in an oxidizing atmosphere so as to decompose and oxidise the impregnant compound into the oxide formed in situ and filling the pores so that the electrostatic attractive force can be increased as a consequence of the increase in the effective dielectric constant along with high resistance against any corrosive gaseous atmosphere as compared with conventional pore-filling materials such as epoxy resins.

2 Claims, No Drawings

ELECTROSTATIC CHUCK

BACKGROUND OF THE INVENTION

The present invention relates to an electrostatic chuck or, more particularly, relates to an electrostatic chuck used for holding and transporting, for example, a semiconductor silicon wafer, liquid crystal display panel or other articles under processing in the manufacturing process of electronic devices by means of the electrostatic attractive force.

It is a remarkable trend in recent years in the manufacturing process, in particular, of electronic devices such as semiconductor devices based on silicon wafers, liquid crystal display panels and the like that various processing steps such as etching, ion-implantation and the like are conducted under dry conditions since high productivity by automatization can be obtained by these dry processes easily as compared with traditional wet processes. One of the remarkable characteristics in these dry processes is that the treatment of the articles is performed in an atmosphere of high vacuum. Further, devices having a larger and larger size and finer and finer patterning with high precision for an increased density of circuit integration are required in the modern electronic industry.

Needless to say, the material under processing, e.g., semiconductor silicon wafers, glass substrate plates and the like, in such a processing treatment must be held or transported by some chucking means. One of the conventional chucking devices used for such a purpose is a vacuum chuck using a chucking plate having perforations and connected to an evacuation means so as to attract the work piece by the sucking action. In principle, such a vacuum chuck cannot be used in a vacuum atmosphere because of the absence of any pressure difference between the surfaces of the work poece. Even as a chucking means used under normal pressure, vacuum chucks have a problem that the attractive force by suction is localized on and around the perforations in the chucking plate so that a local strain is caused in the work piece under working chucked thereby resulting in a decreased accuracy of alignment of the work piece for processing. Accordingly, vacuum chucks are considered not to be suitable for use in the manufacturing process of electronic devices due to this serious problem.

In place of the above mentioned vacuum chucks, electrostatic chucks, in which the work piece is held to the chucking plate by means of the electrostatic attractive force, are highlighted as a promising chucking means for holding and transporting various kinds of work pieces. Conventional electrostatic chucks typically have a structure in which metal electrodes connected to a direct-current power source are integrally embedded within a body of a dielectric material at such a depth near to the chucking surface or metal electrodes are sandwiched with two plates of a rubber or a synthetic resin such as polyimide as a dielectric material and they are integrally bonded together by use of an adhesive.

The attractive force F of such an electrostatic chuck is expressed by the equation $$F = k \cdot \epsilon \cdot s \cdot E^2 / t^2, \quad (1)$$

in which $\epsilon$ is the dielectic constant of the dielectric material, s is the area of the attracting surface, E is the voltage applied to the electrodes, t is the thickness of the layer of the insulating dielectric material and k is a constant. Accordingly, the attractive force is increased in proportion to the dielectric constant $\epsilon$ of the dielectric layer so that it is preferable that the dielectric layer is formed from a ceramic material having a large dielectric constant. A ceramic layer can be provided on the internal electrode layer either by bonding a sintered ceramic sheet prepared beforehand to the electrode layer or by the method of flame spraying or plasma spraying of a ceramic powder. A problem in such a ceramic layer is that the ceramic material is more or less porous containing many pores formed by degassing in the course of the sintering process or by entrainment of gases in the course of the flame spraying. When the ceramic layer contains a large volume of pores, the effective dielectric constant of the ceramic layer is necessarily decreased in addition to the problems that the mechanical strengths of the ceramic layer are decreased so that the thickness t of the ceramic layer cannot be decreased as desired and the accuracy and smoothness of surface finishing would be greatly affected thereby.

In this regard, Japanese Patent Kokai 58-137536 proposes an improvement according to which pores of the dielectric layer of electrostatic chucks are filled with a polymeric material such as epoxy resins, fluorocarbon resins and the like. This method is indeed effective to some extent insofar as the electrostatic chuck is used under relatively mild conditions. Such a resin-impregnated ceramic material, however, is no longer a satisfactory material when the electrostatic chuck is used at an extremely low temperature or at a very high temperature sometimes exceeding 300° C. due to the possible thermal degradation of the polymeric material or when the electrostatic chuck is used in an atmosphere of a reactive or corrosive gas such as halogens, high-concentration oxygen gas and the like as is frequently used in the process of dry etching or in an atmosphere of plasma because these polymeric materials can hardly withstand such an environmental condition.

SUMMARY OF THE INVENTION

The present invention accordingly has an object to provide a novel and improved electrostatic chuck, of which the electrically insulating dielectric layers sandwiching the internal electrode layer are made from a ceramic material, capable of exhibiting an increased attractive force owing to the improvement in respect of the effective dielectric constant of the dielectric layers but still having excellent serviceability even when the electrostatic chuck is used under extreme temperature conditions or in a strongly corrosive atmosphere. The invention also provides a method for the preparation of such an improved electrostatic chuck.

Thus, the electrostatic chuck of the present invention comprises two dielectric layers each made from an electrically insulating ceramic material and an internal electrode layer integrally interposed between the dielectric layers, the pores in the ceramic material being filled with an oxide of an inorganic element such as silicon, aluminum or magnesium.

The above defined improved electrostatic chuck of the invention can be prepared by the method comprising the steps of: impregnating the pores in the ceramic material, either before or after integration with the internal electrode layer, with a liquid containing a thermally decomposable compound of silicon, aluminum or magnesium; and heating, in an oxidizing atmosphere, the ceramic material with the pores filled with the liquid so as to decompose and oxidize the compound of silicon, aluminum or magnesium into respective oxide.

DETAILED DESCRIPTION OF THE PREFERRED EMBODIMENTS

As is described above, the most characteristic feature of the inventive electrostatic chuck consists in that the ceramic material, which is inherently more or less porous, forming the dielectric layers sandwiching the internal electrode layer has the pores filled with an oxide of silicon, aluminum or magnesium or, preferably, silicon or aluminum formed in situ. By virtue of these oxides filling the pores, the dielectric layers can be imparted with a greatly increased effective dielectric constant as compared with the same ceramic material with pores left vacant to be freed from the trouble of dielectric breakdown. In addition, these filling oxides are very stable even at an extreme temperature and are highly resistant against any corrosive gas so that the electrostatic chuck serves with greatly increased reliableness and durability.

The essential component elements of the inventive electrostatic chuck include a first dielectric layer, a second dielectric layer and an internal electrode layer integrally interposed between the two dielectric layers of which each of the dielectric layers is formed from an electrically insulating ceramic material. The ceramic material forming the dielectric layers is not particularly limitative but is exemplified by alumina, silica, zirconium oxide, aluminum nitride, boron nitride, silicon nitride, sialon and the like. The internal electrode layer is formed naturally from an electroconductive material or, in particular, from a metal such as copper, aluminum, titanium, molybdenum, tungsten and the like, of which the metals having a high melting point such as molybdenum and tungsten are sometimes preferred. The dielectric layers of the ceramic material usually have a form of a circular disc though not particularly limitative thereto depending on the particular service for which the electrostatic chuck is used. The pattern of the internal electrode layer is also varied depending on the types of the electrostatic chuck which can be either of a single-electrode type, which is used with the work piece as chucked as the counter-electrode, or a double-electrode type, of which the internal electrode layer is divided into two electrodes.

A typical procedure for the preparation of such a three-layered structure is as follows, though not particularly limitative thereto. For example, two green ceramic sheets are prepared from a suitable ceramic material and by a suitable method such as slip casting on a carrier film and one of the green sheets is provided on one surface with the internal electrode layer followed by putting the other green sheet thereon to give an integral laminate body by pressing, which is then subjected to a sintering treatment by heating at a high temperature. Alternatively, a sintered ceramic sheet is provided with the internal electrode layer by the method of flame spraying or other suitable method followed by further flame spraying of a ceramic powder to form the second dielectric layer. A lead wire is then bonded to the electrode or each of the electrodes in the internal electrode layer so that the electrostatic chuck is completed.

Irrespective of the method for the formation of the dielectric layer, any ceramic material is inherently porous and contains a certain volume of pores which adversely affect the performance of the electrostatic chuck as mentioned before. In the electrostatic chucks of the invention, the pores are filled with an oxide of silicon, aluminum or magnesium or, preferably, silicon or aluminum so that the drawbacks due to the presence of pores in the ceramic layers can be advantageously dissolved. Needless to say, however, no method is known by which tiny pores as in a ceramic material can be directly impregnated with a solid material such as an oxide of these elements. Therefore, the oxide must be formed in situ in the pores by first filling the pores of the ceramic body with a liquid or solution containing a thermally decomposable compound of silicon, aluminum or magnesium and then heating the ceramic body impregnated with the liquid or solution in an atmosphere of an oxidizing gas such as air so as to decompose and oxidize the compound into the respective oxide.

Suitable thermally decomposable compounds of these elements include alkoxides and partial hydrolysis-condensation products thereof still soluble in an organic solvent. Examples of the alkoxides of silicon and aluminum include tetramethoxy silane, tetraethoxy silane, tetra(isopropoxy) silane, tri(isopropoxy) aluminum and the like though not particularly limitative thereto. These alkoxides or partial hydrolysis-condensation products thereof can be used, if necessary, as diluted by dissolving in an organic solvent which is preferably an alcohol such as methyl alcohol, ethyl alcohol, isopropyl alcohol and the like.

The ceramic body having pores can be impregnated with the liquid or solution by merely immersing the ceramic body in the liquid or solution but the technique of vacuum-pressure impregnation ensures more complete impregnation. The temperature at which the ceramic material impregnated with the compound of silicon or aluminum is heated naturally depends on the type of the compound but it is usually in the range from 200° to 1000° C.

In the following, the electrostatic chuck of the invention and the method for the preparation thereof are illustrated in more detail by way of examples and comparative examples.

Examples 1 to 3 and Comparative Examples 1 to 3

A ceramic slip having a viscosity of 40,000 centipoise was prepared by admixing 100 parts by weight of a powder mixture of 92% by weight of an aluminum nitride powder, 5% by weight of a yttrium oxide powder and 3% by weight of a calcium oxide powder with 10 parts by weight of a polyvinyl butyral resin, 50 parts by weight of trichloroethylene, 8 parts by weight of ethyl alcohol and 2 parts by weight of dioctyl phthalate followed by milling in a ball mill for 40 hours and deaeration under a reduced pressure to remove air bubbles along with evaporation of a part of the solvents.

A green ceramic sheet having a thickness of 1 mm was prepared by spreading the slip over a carrier film by using a doctor blade and two green disc sheets having a diameter of 180 mm were taken therefrom by cutting. One of these green disc sheets was provided on one surface with a concentric circular pattern of an electrode pair, of which each of the electrode zones had a width of 2 mm, by screen printing using a 400 mesh screen with a tungsten paste to serve as the internal electrode layer. The other green disc sheet was laid on the electrode layer and the laminate was pressed at 100° C. under a pressure of 5 kg/cm$^2$ into an integrated laminate which was subjected to sintering of the ceramic layers by heating at 1850° C. for 3 hours in an atmosphere of a gaseous mixture of 20% by volume of hydrogen and 80% by volume of nitrogen.

In Example 1, the thus obtained sintered laminate as an electrostatic chuck was impregnated with tetraethoxy silane followed by heating in air at 400° C. for 1 hour so as to decompose the tetraethoxy silane into silicon dioxide filling the pores of the ceramic layers. The impregnant in Example 2 was tri(isopropoxy) aluminum in place of tetraethoxy silane in Example 1 so that the oxide filling the pores of the ceramic layers was aluminum oxide. In Example 3, the impregnant of the pores was tetramethoxy silane with admixture of 10% by weight of boric acid so that the material filling the pores of the ceramic layers was a composite of silicon dioxide and boron oxide.

Each of the thus prepared electrostatic chucks was subjected to the measurement of the electrostatic attractive force at 250° C. with application of a direct-current voltage of 600 volts between the electrodes by measuring the force required for pulling apart a semiconductor silicon wafer having a thickness of 0.6 mm and a diameter of 6 inches on the chucking surface. The results were that the attractive force was 8.5 g/cm$^2$, 7.8 g/cm$^2$ and 9.2 g/cm$^2$ of the chucking surface area in Examples 1, 2 and 3, respectively. Further, the electrostatic chucks were kept at 250° C. for 100 hours in an atmosphere of plasma of carbon tetrafluoride under a pressure of 1 Torr to find absolutely no changes in the appearance to indicate that these chucks were highly resistant against the corrosive atmosphere of plasma.

For comparison, the same preparation and tests as above were undertaken in Comparative Example 1 excepting omission of impregnation of the pores in the ceramic layers with an in situ formed oxide. The value of the electrostatic attractive force was 4.3 g/cm$^2$ to be much lower than in Examples 1 to 3. The resistance against the corrosive atmosphere of plasma was as good as in Examples 1 to 3.

For further comparison, the same preparation and tests as in Examples 1 to 3 were undertaken in Comparative Example 2 except that the impregnant of the pores of the ceramic layers was tetraethoxy titanium so that the oxide filling the pores after the heat treatment was titanium dioxide. The test of the attractive force failed to give a result because of the dielectric breakdown caused at the applied voltage of 600 volts although no problem was noted in the resistance against the corrosive atmosphere of plasma.

In Comparative Example 3, the pores of the ceramic layers was filled with an epoxy resin which was cured by heating the chuck at 120° C. for 30 minutes. No measurement of the attractive force could be undertaken at 250° C. with the thus prepared electrostatic chuck due to decomposition of the cured epoxy resin. Further, this chuck was poorly resistant against the corrosive atmosphere of plasma with formation of a black matter on the surface.

What is claimed is:

1. An electrostatic chuck which comprises: two dielectric layers each made from porous electrically insulating ceramic material; and an internal electrode layer integrally interposed between the dielectric layers, the pores in the ceramic material being filled with an oxide of an inorganic element formed in situ.

2. The electrostatic chuck as claimed in claim 1 in which the inorganic element is selected from the group consisting of silicon, aluminum and magnesium.

* * * * *